United States Patent
Kuribayashi (10) Patent No.: US 9,019,684 B2
(45) Date of Patent: Apr. 28, 2015

(54) ELECTROSTATIC CHUCK AND METHOD FOR MANUFACTURING ELECTROSTATIC CHUCK

(71) Applicant: Shinko Electric Industries Co., Ltd., Nagano-ken (JP)

(72) Inventor: Akihiro Kuribayashi, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 52 days.

(21) Appl. No.: 13/903,313

(22) Filed: May 28, 2013

(65) Prior Publication Data
US 2013/0321974 A1 Dec. 5, 2013

(30) Foreign Application Priority Data
May 29, 2012 (JP) .................................. 2012-122201

(51) Int. Cl.
*H01L 21/683* (2006.01)
*H01L 21/67* (2006.01)

(52) U.S. Cl.
CPC ...... *H01L 21/6833* (2013.01); *H01L 21/67109* (2013.01)

(58) Field of Classification Search
CPC .................. H01L 21/67109; H01L 21/6833

USPC ........................................................ 361/234
See application file for complete search history.

(56) References Cited

U.S. PATENT DOCUMENTS

2007/0139856 A1* 6/2007 Holland et al. ............... 361/234
2010/0078424 A1* 4/2010 Tsukamoto et al. ........ 219/444.1

FOREIGN PATENT DOCUMENTS

JP 2009-152475 A 7/2009

* cited by examiner

*Primary Examiner* — Scott Bauer
(74) *Attorney, Agent, or Firm* — Wolf, Greenfield & Sacks, P.C.

(57) ABSTRACT

An electrostatic chuck plate is connected to a base plate, which includes a cooling mechanism, by an adhesive layer. The electrostatic chuck plate includes a substrate setting surface on which a processed substrate is set, an electrostatic electrode capable of attracting the processed substrate, and a resistance heat generation body capable of heating the processed substrate. The electrostatic electrode and the resistance heat generation body are incorporated in the electrostatic chuck plate. An adjustment portion is arranged at a position according to a temperature distribution of the substrate setting surface in at least one of the upper surface of the base plate and a lower surface of the electrostatic chuck plate that faces the upper surface through the adhesive layer. The adjustment portion is filled with a resin having a heat conductivity according to the temperature distribution.

7 Claims, 9 Drawing Sheets

ELECTROSTATIC CHUCK AND METHOD FOR MANUFACTURING ELECTROSTATIC CHUCK

CROSS-REFERENCE TO RELATED APPLICATIONS

This application is based upon and claims the benefit of priority from prior Japanese Patent Application No. 2012-122201, filed on May 29, 2012, the entire contents of which are incorporated herein by reference.

FIELD

This disclosure relates to an electrostatic chuck and a method for manufacturing the electrostatic chuck.

BACKGROUND

A film formation device, such as a chemical vapor deposition (CVD) device or a physical vapor deposition (PVD) device, or a plasma etching device is used to form a semiconductor element. Such devices include a stage to hold a substrate (e.g., silicon wafer) in a depressurized processing chamber. One such stage is an electrostatic chuck including, for example, an electrostatic chuck (ESC) plate adhered to a base plate (base). Japanese Laid-Open Patent Publication No. 2009-152475 describes an electrostatic chuck plate incorporating an electrode, which is capable of attracting a substrate, and a heat generation body, which controls the temperature of the subject to be attracted (i.e., substrate). The temperature of the substrate attracted to an upper surface of the electrostatic chuck plate is adjusted by a cooling fluid, which flows through a conduit formed in the base plate, and the heat generation body, which is incorporated in the electrostatic chuck plate.

In the electrostatic chuck, the heat density may vary at the upper surface (substrate setting surface) of the electrostatic chuck plate that attracts the substrate. Such variation in the heat density causes variations in the temperature of the substrate. This may vary, for example, the etching rate of the plasma etching device and thereby lower the yield of the semiconductor element.

SUMMARY

One aspect of the present invention is an electrostatic chuck. The electrostatic chuck includes a base plate, an adhesive layer arranged on an upper surface of the base plate, and an electrostatic chuck plate connected to the base plate by the adhesive layer. The base plate includes a cooling mechanism. The electrostatic chuck plate includes a substrate setting surface on which a processed substrate is set, an electrostatic electrode capable of attracting the processed substrate, and a resistance heat generation body capable of heating the processed substrate. The electrostatic electrode and the resistance heat generation body are incorporated in the electrostatic chuck plate. The electrostatic chuck further includes an adjustment portion arranged at a position according to a temperature distribution of the substrate setting surface in at least one of the upper surface of the base plate and a lower surface of the electrostatic chuck plate that faces the upper surface through the adhesive layer. The electrostatic chuck further includes a resin having a heat conductivity according to the temperature distribution and filled in the adjustment portion.

Other aspects and advantages of the present invention will become apparent from the following description, taken in conjunction with the accompanying drawings, illustrating by way of example the principles of the invention.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. In the drawings, like numerals are used for like elements throughout.

DESCRIPTION OF THE EMBODIMENTS

Hereinafter, various embodiments will be described with reference to the accompanying drawings. The accompanying drawings may illustrate features in an enlarged manner to facilitate understanding. In the cross-sectional views, hatching lines may be eliminated to facilitate understanding of the cross-sectional structure of each element.

Figure 1A:
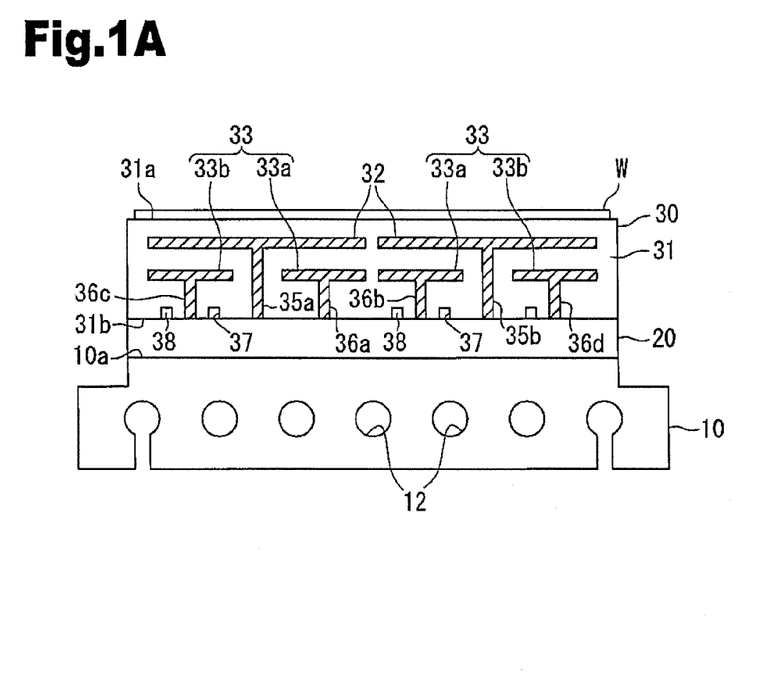
FIG. 1A is a schematic cross-sectional view of an electrostatic chuck.

Referring to FIG. 1A, an electrostatic chuck includes a base plate 10 (base), an adhesive layer 20, and an electrostatic chuck (ESC) plate 30. The electrostatic chuck plate 30 is adhered to the base plate 10 by the adhesive layer 20.

The base plate 10 has an upper surface 10a, which contacts the adhesive layer 20, and a plurality of cooling conduits 12 arranged along a plane parallel to the upper surface 10a in the base plate 10. The cooling conduits 12 are in communication with each other in the base plate 10. A cooling medium flows from the cooling conduit 12 at the left end toward the cooling conduit 12 at the right end to adjust the temperature of a substrate W (processed substrate) held by the electrostatic chuck plate 30 to a given temperature. The cooling medium is, for example, water or Galden. The substrate W is, for example, a silicon wafer. The cooling conduits 12 serve as a cooling mechanism.

The base plate 10 may be made of a metal material, such as aluminum and cemented carbide, or a composite material of such a metal material and a ceramic material. In the present embodiment, the base plate 10 is made of aluminum or an aluminum alloy due to availability, easiness to machine, satisfactory heat conductivity, and the like. The surface of the base plate 10 undergoes alumite processing (formation of insulating layer). The base plate 10 has a thickness from 35 mm to 40 mm, for example.

The adhesive layer 20 transmits the heat of the electrostatic chuck plate 30 to the base plate 10. A Resistance heat generation bodies 33 heat the electrostatic chuck plate 30. As described above, the cooling medium cools the base plate 10. The adhesive layer 20 transmits the heat of the electrostatic chuck plate 30 to the base plate 10. Further, current supplied to the resistance heat generation bodies 33 is controlled so that the temperature of the electrostatic chuck plate 30 conforms to a given temperature. Preferably, the adhesive layer 20 is made of a material having high heat conductivity, such as silicone resin. The adhesive layer 20 has a thickness from 0.5 mm to 2.0 mm, for example.

Figure 1B:
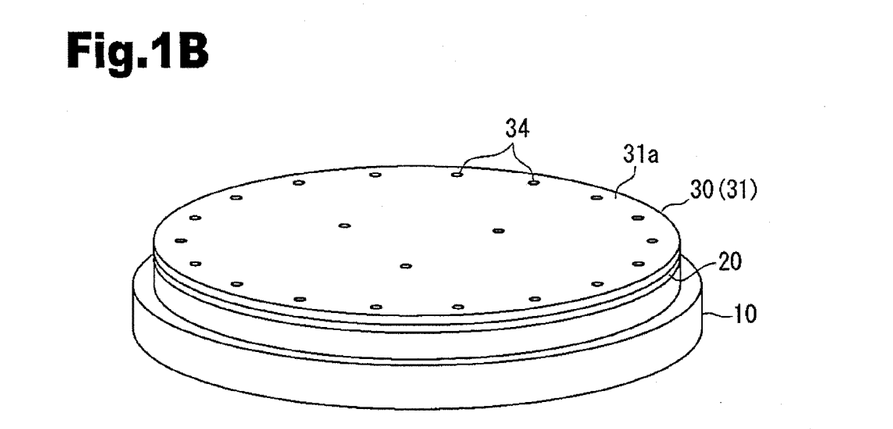
FIG. 1B is a schematic perspective view of the electrostatic chuck.

Referring to FIG. 1B, the electrostatic chuck plate 30 is disk-shape and has a size (diameter) of, for example, 300 mm. The electrostatic chuck plate 30 has a thickness from 2 mm to 3 mm, for example.

As illustrated in FIG. 1A, the electrostatic chuck plate 30 includes a plate body 31 (base body), electrostatic electrodes 32, and the resistance heat generation bodies 33. The electrostatic electrodes 32 and the resistance heat generation bodies 33 are incorporated in the plate body 31. The plate body 31 includes a substrate setting surface 31a (upper surface as viewed in FIG. 1A), on which the substrate W is set, and an adhering surface 31b (lower surface as viewed in FIG. 1A) that faces the upper surface 10a of the base plate 10 and is adhered to the adhesive layer 20. The substrate setting surface 31a and the adhering surface 31b are parallel to each other.

Referring to FIG. 1B, a plurality of through holes 34 extend through the plate body 31 in the thicknesswise direction. For example, a lift pin and a sensor, such as a temperature sensor, are arranged in the through holes 34. FIG. 1A does not illustrate the through holes 34.

The plate body 31 is made from an insulating material. For example, the material of the plate body 31 may be a ceramics, such as alumina, aluminum nitride, or silicon nitride, or an organic material, such as silicone resin or polyimide resin. In the present embodiment, the plate body 31 is made of a ceramic, such as alumina or aluminum nitride, due to availability, easiness to machine, and relatively high resistance to plasma. In particular, aluminum nitride has a high heat conductivity of 150 to 250 W/(m·K) and is thus preferable for reducing the in-plane temperature variation of the subject (in this case, substrate W) to be attracted and held by the electrostatic chuck plate 30.

The electrostatic electrode 32 has the form of a thin film. The electrostatic electrodes 32 are incorporated in the plate body 31 proximate to the substrate setting surface 31a. Electrodes 35a and 35b electrically connect the electrostatic electrodes 32 to an attraction power supply (not illustrated). The electrostatic electrodes 32 use the voltage from the attraction power supply to generate electrostatic force that fixes the substrate W to the substrate setting surface 31a. The electrostatic electrodes 32 may be made of tungsten (W) or molybdenum (Mo), for example.

The resistance heat generation bodies 33 are incorporated in the plate body 31 between the adhering surface 31b and the electrostatic electrodes 32.

The resistance heat generation bodies 33 each include a first resistance heat generation body 33a and a second resistance heat generation body 33b. The first and second resistance heat generation bodies 33a and 33b are arranged along a plane parallel to the substrate setting surface 31a in the plate body 31. The first and second resistance heat generation bodies 33a and 33b are electrically insulated from the electrostatic electrodes 32.

Figure 2A:
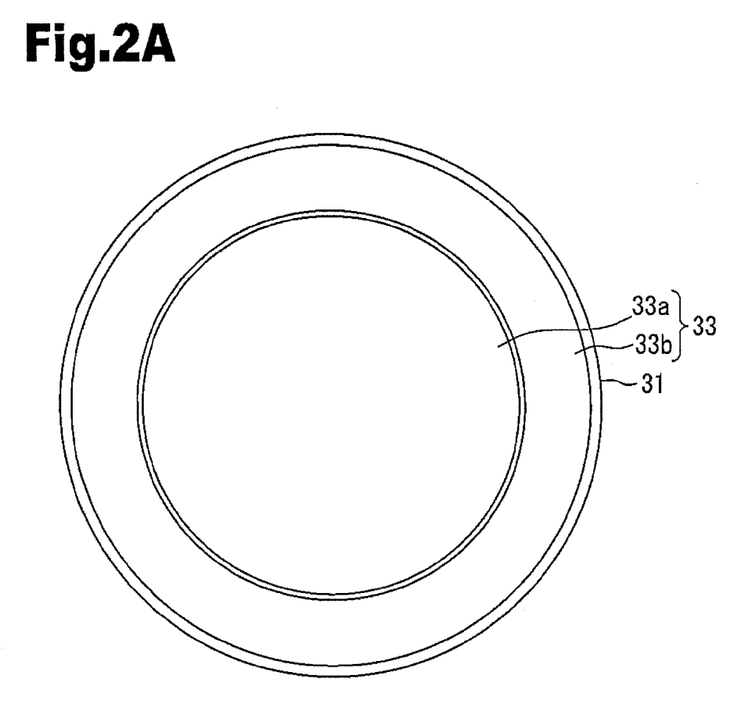
FIG. 2A is a diagram of a resistance heat generation body.
Figure 2B:
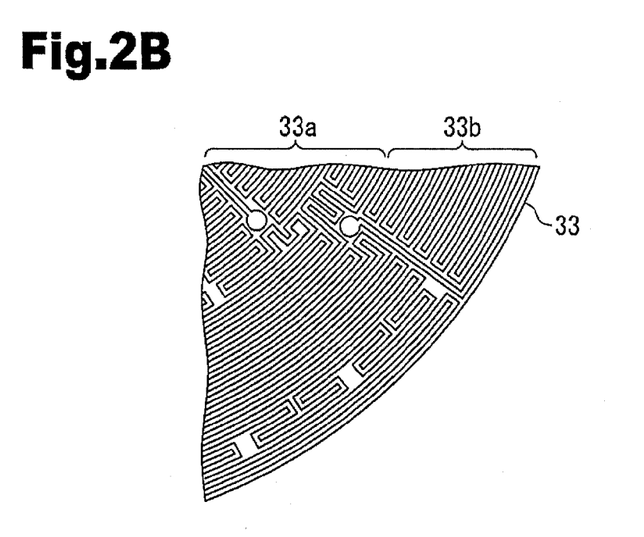
FIG. 2B is a partially enlarged view of the resistance heat generation body.

As illustrated in FIG. 2A, the first resistance heat generation body 33a is arranged at a central portion of the plate body 31. The second resistance heat generation body 33b is arranged at a peripheral portion of the plate body 31. FIG. 2A schematically illustrates the region where the first and second resistance heat generation bodies 33a and 33b are formed. As illustrated in FIG. 2B, the first and second resistance heat generation bodies 33a and 33b are each formed by a wiring pattern having a width that is set to obtain a given resistance value. Each wiring pattern is arranged such that the heat density becomes uniform in the region where the first and second resistance heat generation bodies 33a and 33b are formed. The resistance value of the first resistance heat generation body 33a is set to, for example, 82 ohms (Ω), and the resistance value of the second resistance heat generation body 33b is set to, for example, 75 ohm (Ω).

As illustrated in FIG. 1A, the first resistance heat generation body 33a is electrically connected to the electrodes 36a and 36b. The electrodes 36a and 36b electrically connect the first resistance heat generation body 33a to a heating power supply (not illustrated). Voltage from the heating power supply heats the first resistance heat generation body 33a. The first resistance heat generation body 33a heats a central portion of the substrate W held on the substrate setting surface 31a of the plate body 31.

The second resistance heat generation body 33b is electrically connected to electrodes 36c and 36d. The electrodes 36c and 36d electrically connect the second resistance heat generation body 33b to a heating power supply (not illustrated). Voltage from the heating power supply heats the second resistance heat generation body 33b. The second resistance heat generation body 33b heats a peripheral portion of the substrate W held on the substrate setting surface 31a of the plate body 31.

The plate body 31 includes at least one adjustment portion 37. Referring to FIG. 1A, five adjustment portions 37 are formed in the adhering surface 31b of the plate body 31 in the present embodiment. Each adjustment portion 37 is recessed from the adhering surface 31b toward the substrate setting surface 31a. The adjustment portion 37 is, for example, a recess having a circular opening. The adjustment portion 37 is filled with an adjustment resin 38. The material of the adjustment resin 38 is, for example, silicone resin, which is the same as the material of the adhesive layer 20.

The position, shape, and number of the adjustment portions 37 as well as the material of the adjustment resin 38 are set to obtain a uniform heat density in the substrate setting surface 31a in accordance with the shape of the electrostatic chuck plate 30. The shape of the electrostatic chuck plate 30 relates to, for example, the shape (width, thickness, etc. of wiring pattern) of the resistance heat generation bodies 33 incorporated in the plate body 31.

The operation of the electrostatic chuck will now be described.

As described above, the shape of the resistance heat generation bodies 33 are designed so that the heat density is uniform in the region where the resistance heat generation bodies 33a and 33b are formed. However, variations resulting from the manufacturing process are produced in the shape of the resistance heat generation bodies 33 such as in the width and thickness of the wiring pattern. Such shape variation causes resistance value variations in portions of the resistance heat generation bodies 33, that is, heat generation amount variations in portions of the resistance heat generation bodies 33. Accordingly, variations in the shape of the resistance heat generation bodies 33 lead to non-uniform heat density in the substrate setting surface 31a.

For example, when the pattern width of the resistance heat generation bodies 33 is greater than a designed value, the resistance value of the resistance heat generation bodies 33 is decreased in accordance with the difference between the pattern width and the designed pattern. This lowers the heat generation temperature. Therefore, the difference between the heat generation temperature and the designed temperature corresponds to the difference between the pattern width and the designed pattern. Thus, the position, shape, and number of the adjustment portion 37, as well as the material (heat conductivity) of the adjustment resin 38 filled into each adjustment portion 37 are selected in accordance with the difference between the heat generation temperature and the designed temperature, that is, the difference between the pattern width and the designed pattern. In other words, the position, shape, and number of the adjustment portion 37 as well as the material of the adjustment resin 38 are determined so that the heat density in the substrate setting surface 31a of the plate body 31 is uniform.

For example, the heat conductivity of the silicone resin is lower than the heat conductivity of the plate body 31 (e.g., alumina ceramics). Thus, depending on the shape of the adjustment portion 37, for example, the depth of the adjustment portion 37 (length in the thicknesswise direction of the plate body 31), a difference in heat conduction is produced between a location where an adjustment portion 37 is formed and a location where an adjustment portion 37 is not formed. The range in which the difference in heat conduction is produced corresponds to the shape of the adjustment portion 37, for example, the area (opening area) of the recess. Therefore, the position, shape (includes size), and number of the adjustment portions 37 are set to adjust the heat density and the distribution of the heat density in the substrate setting surface 31a of the plate body 31. This allows for uniform control of the temperature of the substrate W held on the substrate setting surface 31a of the plate body 31.

A method for manufacturing the electrostatic chuck will now be described.

Figure 3:
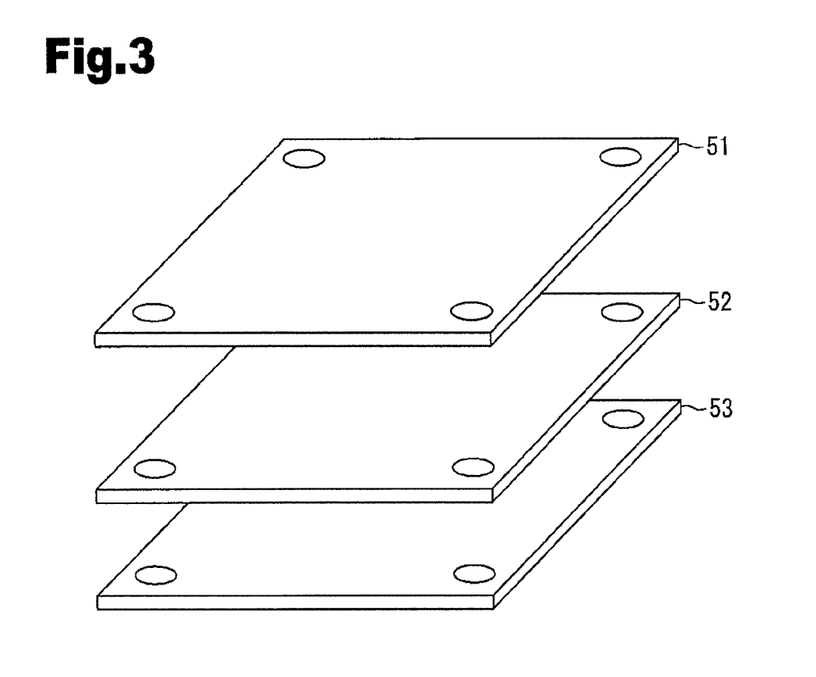
FIGS. 3 to 15 are perspective views illustrating manufacturing steps of the electrostatic chuck.

First, as illustrated in FIG. 3, a plurality of (three in FIG. 3) tetragonal green sheets 51 to 53 are prepared. Each of the green sheets 51 to 53 is formed by mixing alumina with a binder, solvent, and the like, for example. Further, each of the green sheets 51 to 53 has a size that is in correspondence with the size of the electrostatic chuck plate 30 illustrated in FIG. 1A.

The green sheet 51 is baked in a step described later to form a portion of the plate body 31 including the substrate setting surface 31a illustrated in FIG. 1A. The green sheet 52 is baked in a step described later to form a portion of the plate body 31 between the electrostatic electrodes 32 and the resistance heat generation bodies 33. The electrostatic electrodes 32 illustrated in FIG. 1A are formed on the green sheet 52. The green sheet 53 is baked in a step described later to form a portion of the plate body 31 including the adhering surface 31b. The resistance heat generation bodies 33 illustrated in FIG. 1A are formed on the green sheet 53.

Figure 4:
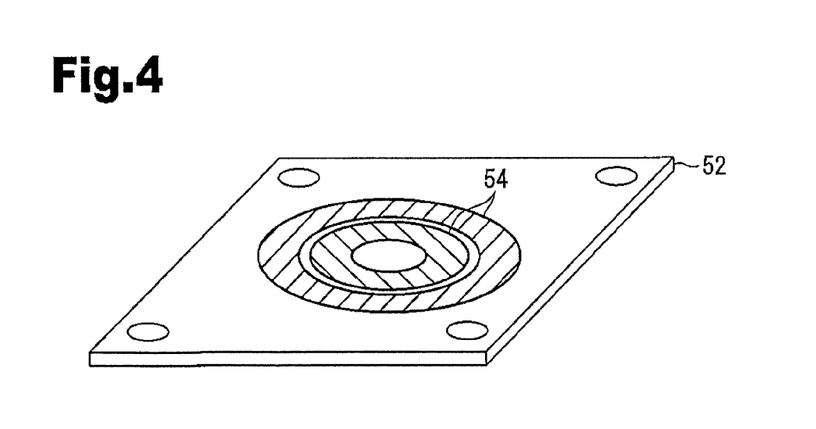

As illustrated in FIG. 4, a wiring pattern 54 is then formed on the upper surface of the green sheet 52 with a conductive paste (e.g., tungsten paste) through a printing process (screen printing), for example. The wiring pattern 54 is baked in a step described later to form the electrostatic electrodes 32. For example, the conductive paste may be a material containing metal particles such as molybdenum (or conductive ceramic particles), a binder, and a solvent.

Figure 5:
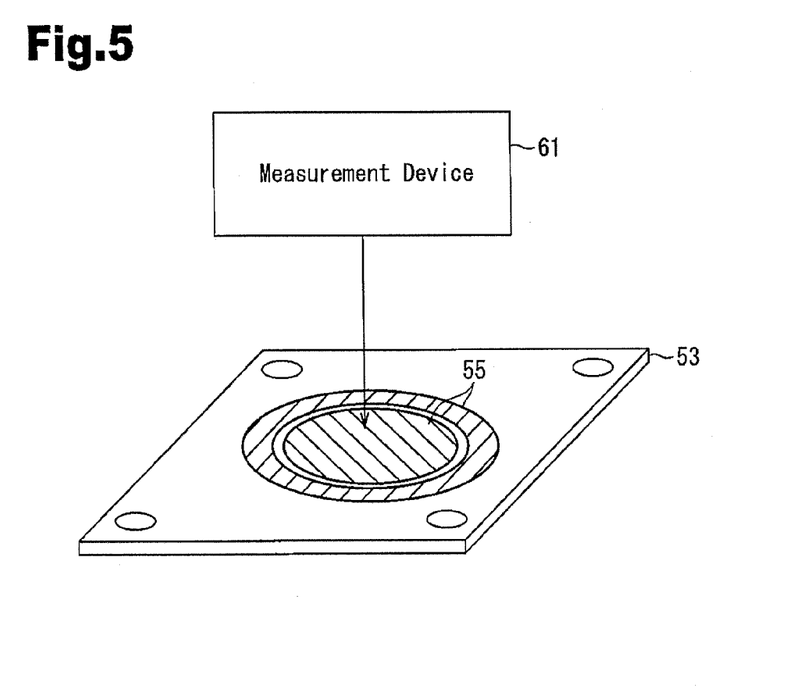

Then, as illustrated in FIG. 5, a wiring pattern 55 is formed on the upper surface of the green sheet 53 with a conductive paste (e.g., tungsten paste) through a printing process (screen printing), for example. The wiring pattern 55 is baked in a step described later to form the resistance heat generation bodies 33. For example, the conductive paste may be a material containing metal particles such as molybdenum (or conductive ceramic particles), a binder, and a solvent.

The shape of the wiring pattern 55 formed on the upper surface of the green sheet 53 is then measured with a measurement device 61. The measurement device 61 includes, for example, a contactless film thickness measurement device and a device that captures images to measure the width of the wiring pattern 55. The measurement device 61 measures the shape (thickness, width) of the wiring pattern 55, and calculates the heat density distribution, that is, the temperature distribution based on the measurement results. For example, the measurement device 61 has a database in which data of the heat density is stored in correspondence with the shape of the wiring pattern. The database is generated by preparing a plurality of sample substrates, and measuring the shape of the wiring pattern formed on each sample substrate and the heat density in the upper surface of each sample substrate. The measurement device 61 acquires the heat density corresponding to the shape of the measured wiring pattern 55 from the database, and calculates the heat density distribution. An arithmetic expression such as primary expression, polynomial expression, or the like, may be used for the calculation of the heat density distribution.

Figure 6:
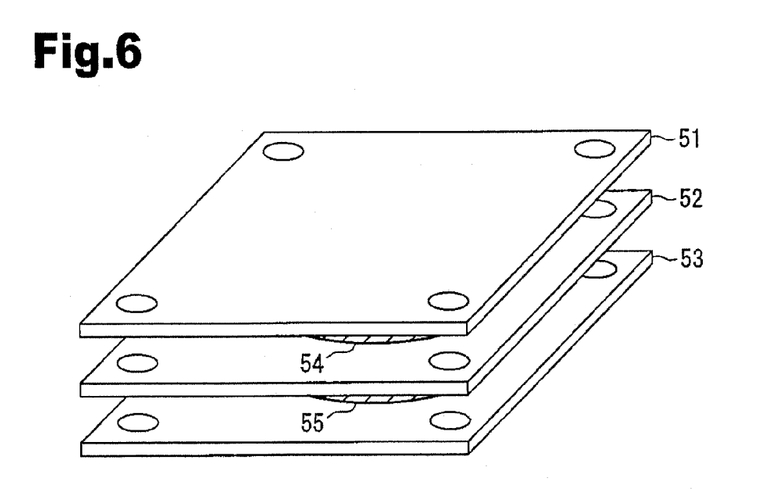
Figure 7:
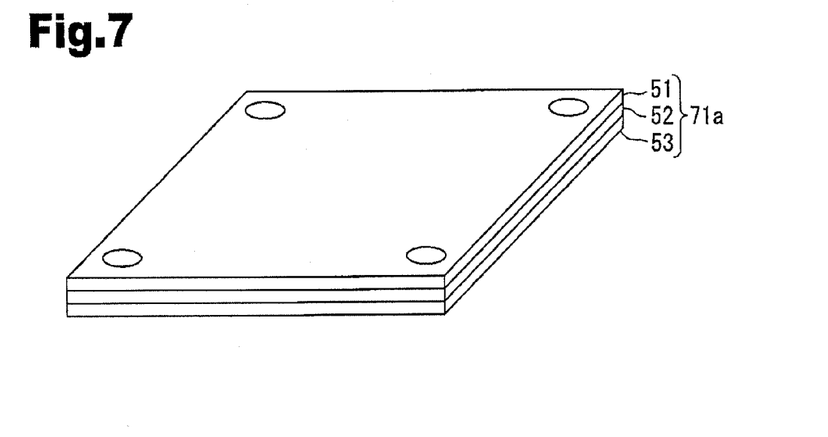

Then, as illustrated in FIG. 6, the green sheets 52 and 53 are stacked with the surfaces of the wiring patterns 54 and 55 facing upward. Further, the green sheet 51 is arranged on the green sheet 52. This forms structure 71a, which is a stacked body of the green sheets 51 to 53, as illustrated in FIG. 7. The green sheets 51 to 53 are heated in a hot pressing process, for example, and adhered to one another.

Figure 8:
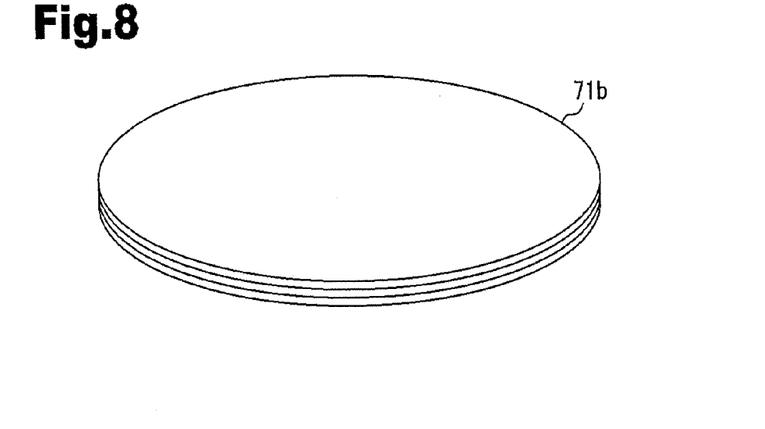

As illustrated in FIG. 8, the periphery of the structure 71a is cut to form a disk-shaped structure 71b.

Figure 9:
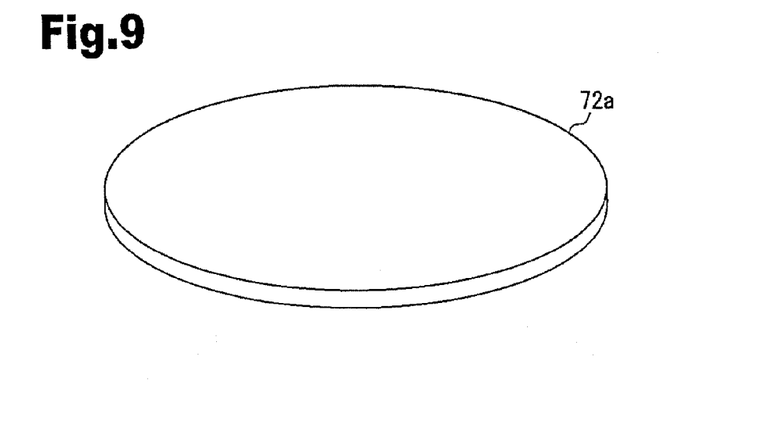

The structure 71b is then baked to obtain a ceramic substrate 72a illustrated in FIG. 9. The baking temperature is, for example, 1600° C. The ceramic substrate 72a incorporates the electrostatic electrodes 32 and the resistance heat generation bodies 33, which are obtained by backing the wiring patterns 54 and 55 illustrated in FIGS. 4 and 5. Although not illustrated, the electrodes 35a, 35b, and 36a to 36d illustrated in FIG. 1A are formed in the same manner as the electrostatic electrodes 32 and the resistance heat generation bodies 33.

Figure 10:
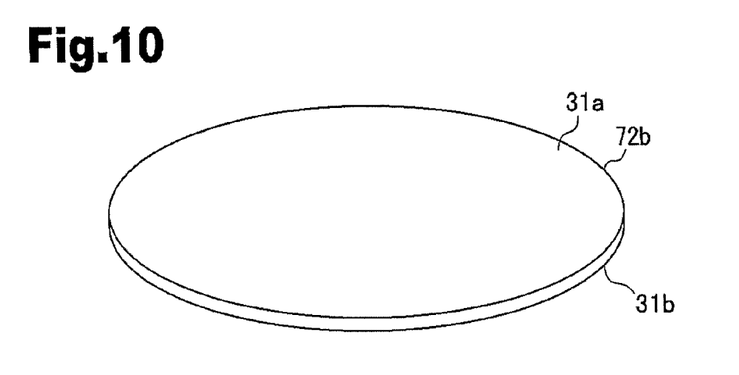

Referring to FIG. 10, upper and lower surfaces of the ceramic substrate 72a are then both polished to obtain a ceramic substrate 72b. The upper surface of the ceramic substrate 72b corresponds to the substrate setting surface 31a, and the lower surface (rear surface in FIG. 10) of the ceramic substrate 72b corresponds to the adhering surface 31b.

Figure 11:
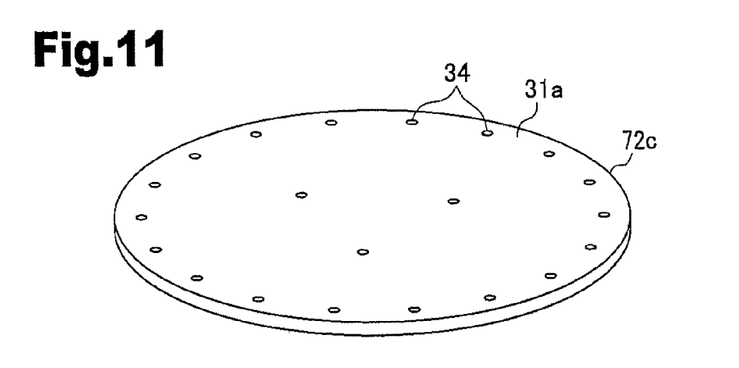

Referring to FIG. 11, the ceramic substrate 72b illustrated in FIG. 10 is then machined to obtain a ceramic substrate 72c including the through holes 34, which extend through the ceramic substrate 72c in the thicknesswise direction. The through holes 34 are used, for example, to lay out a lift pin and a sensor, such as a temperature sensor, and the like.

Figure 12:
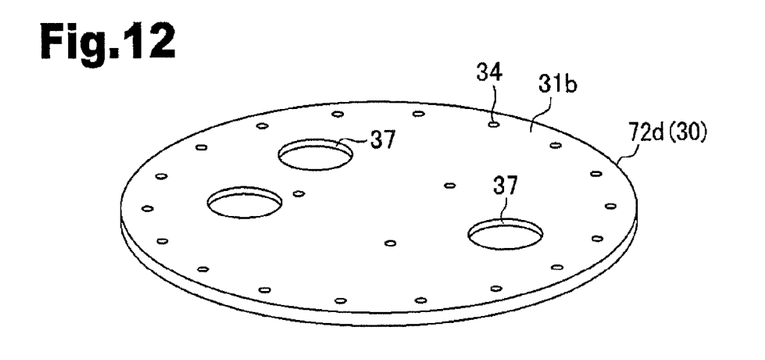

Referring to FIG. 12, the lower surface (adhering surface 31b) of the ceramic substrate 72c illustrated in FIG. 11 is then machined to obtain a ceramic substrate 72d including recesses (adjustment portions 37). The ceramic substrate 72d corresponds to the electrostatic chuck plate 30 illustrated in FIG. 1A. Formation parameters, such as the position, shape (inner diameter etc.), and number of the adjustment portions 37, are set in accordance with the heat generating distribution calculated by the measurement device 61. For example, the formation parameters of the adjustment portions 37 may be set using the database storing the data of the heat density distribution in correspondence with the shape and the like of the recesses (adjustment portions 37). Alternatively, the formation parameters of the adjustment portions 37 may be set using an arithmetic expression for calculating the shape and the like of the recesses (adjustment portion 37) from the heat density distribution. The adjustment portions 37 may be machined in the same step as the step forming the through holes 34. Thus, a new step does not need to be added to form the adjustment portions 37.

Figure 13:
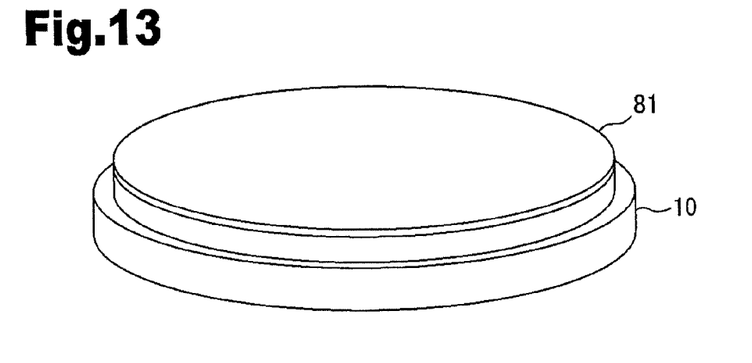

Referring to FIG. 13, a resin 81 (e.g., silicone resin) is then applied to the base plate 10 to form the adhesive layer 20 illustrated in FIG. 1A.

Figure 14:
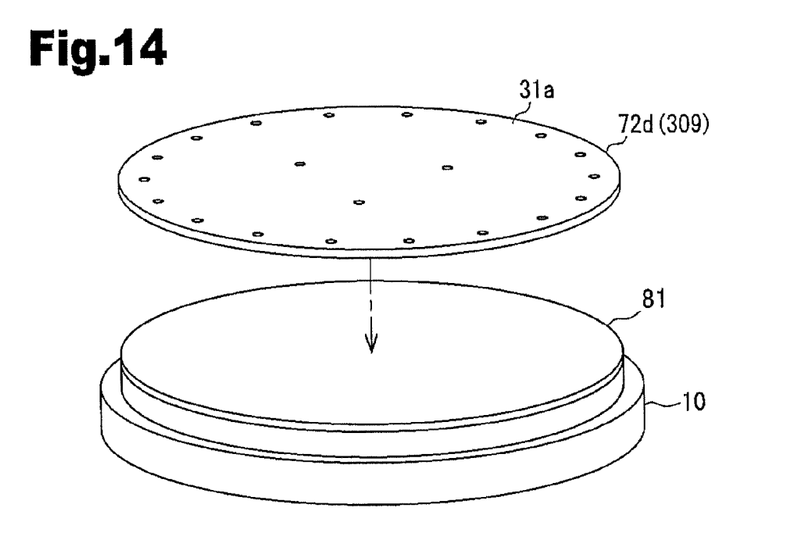

Referring to FIG. 14, the electrostatic chuck plate 30 is stacked on and adhered to the resin 81 with the adhering surface 31b including the adjustment portions 37 (see FIG. 12) facing downward. Here, for example, pressure is applied to the electrostatic chuck plate 30 toward the base plate 10 under a depressurized atmosphere to fill the adjustment portion 37 (see FIG. 12) of the electrostatic chuck plate 30 with the resin 81 applied to the base plate 10. The resin 81 is then thermally cured to form the adhesive layer 20.

Figure 15:
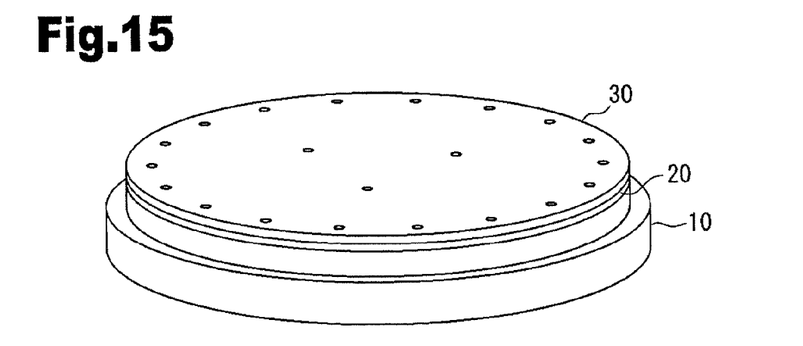

Referring to FIG. 15, the electrostatic chuck plate 30 is ground and flattened to finish the surface of the electrostatic chuck plate 30. This obtains the electrostatic chuck.

The present embodiment has the advantages described below.

(1) The electrostatic chuck plate 30 includes the plate body 31, the electrostatic electrodes 32, and the resistance heat generation bodies 33. The electrostatic electrodes 32 and the resistance heat generation bodies 33 are incorporated in the plate body 31. The plate body 31 includes the substrate setting surface 31a and the opposite adhering surface 31b. The adhering surface 31b is adhered to the upper surface 10a of the base plate 10 by the adhesive layer 20.

The adjustment portions 37 are formed in the adhering surface 31b of the plate body 31 at locations according to the heat density distribution of the substrate setting surface 31a. The adjustment portion 37 is filled with the adjustment resin 38 having a heat conductivity according to the heat density distribution. The material of the adjustment resin 38 is silicone resin, which is, for example, the same as the material of the adhesive layer 20.

The heat conductivity of the adjustment resin 38 (silicone resin) is lower than the heat conductivity of the plate body 31 (e.g., alumina ceramic). Thus, depending on the shape of the adjustment portion 37, for example, the depth (length in the thicknesswise direction of the plate body 31), a difference in heat conduction is produced between a location where an adjustment portion 37 is formed and a location where an adjustment portion 37 is not formed. That is, the amount of heat transmitted in a direction perpendicular to the surface (substrate setting surface 31a) of the electrostatic chuck plate 30 at a location where an adjustment portion 37 is formed is less than a location where the adjustment portion 37 is not formed. Accordingly, the heat density in the substrate setting surface 31a is increased at locations corresponding to where the adjustment portions 37 are formed. This allows the heat density to be adjusted in the substrate setting surface 31a of the plate body 31, and thereby allows the distribution of the heat density to be adjusted. As a result, the temperature of the substrate W held on the substrate setting surface 31a is uniformly controlled.

(2) The green sheet 53 includes the wiring pattern 55 that is baked to obtain the resistance heat generation bodies 33. The shape (film thickness, width) of the wiring pattern 55 is measured by the measurement device 61. The heat density distribution in the substrate setting surface 31a is obtained from the measurement results of the measurement device 61. This easily obtains the heat density distribution of the substrate setting surface 31a.

(3) The adjustment portions 37 formed in the plate body 31 of the electrostatic chuck plate 30 are filled with the adjustment resins 38. A solid (e.g., metal) having a heat conductivity that differs from that of the plate body 31 (ceramic) may be arranged in each adjustment portion 37 so that the heat conduction at the adjustment portion 37 differs from the heat conduction at other locations where the adjustment portion 37 is not formed. However, the arrangement of a solid in each adjustment portion 37 is burdensome. The use of a solid makes it difficult to cope with changes in the shape (size etc.) of the adjustment portion 37. In contrast, the present embodiment fills each adjustment portion 37 with the adjustment resin 38. The use of the adjustment resin 38 allows for easy filling of the adjustment portion 37 and improves the working efficiency. Further, the use of the adjustment resin 38 allows for changes in the shape of the adjustment portion 37 to be easily coped with.

(4) When adhering the electrostatic chuck plate 30 to the base plate 10, the resin (e.g., silicone resin) of the adhesive layer 20 fills each adjustment portion 37 in the plate body 31 of the electrostatic chuck plate 30 to form the adjustment resin 38. That is, the step of filling the adjustment resin 38 into the adjustment portion 37 is carried out in the step of adhering the electrostatic chuck plate 30 to the base plate 10. This reduces the number of steps and shortens the time for manufacturing the electrostatic chuck.

It should be apparent to those skilled in the art that the present invention may be embodied in many other specific forms without departing from the spirit or scope of the invention. Particularly, it should be understood that the present invention may be embodied in the following forms.

In the embodiment described above, the adjustment portions 37 are formed in the adhering surface 31b of the plate body 31, and the adjustment resin 38 is filled in the adjustment portions 37. However, the adjustment portions 37 do not have to be located in the adhering surface 31b and may be arranged in other areas as long as the adjustment portions 37 are located between the resistance heat generation bodies 33 and the cooling conduits 12.

Figure 16:
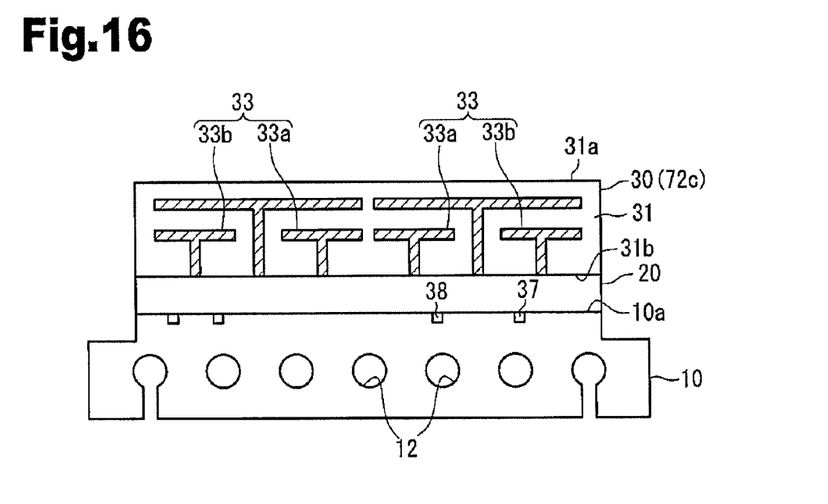
FIG. 16 is a schematic cross-sectional view of another electrostatic chuck.

For example, as illustrated in FIG. 16, the adjustment portion 37 may be formed in the upper surface 10a of the base plate 10. The adjustment portions 37 are filled with the adjustment resin 38 (silicone resin), which is the same as the material of the adhesive layer 20. The heat conductivity of silicone resin is low compared to the material of the base plate 10, for example, aluminum. In the same manner as the embodiment described above, this allows for the heat density in the substrate setting surface 31a of the plate body 31 to be uniform, and allows for the substrate W to be controlled at a uniform temperature.

Figure 17:
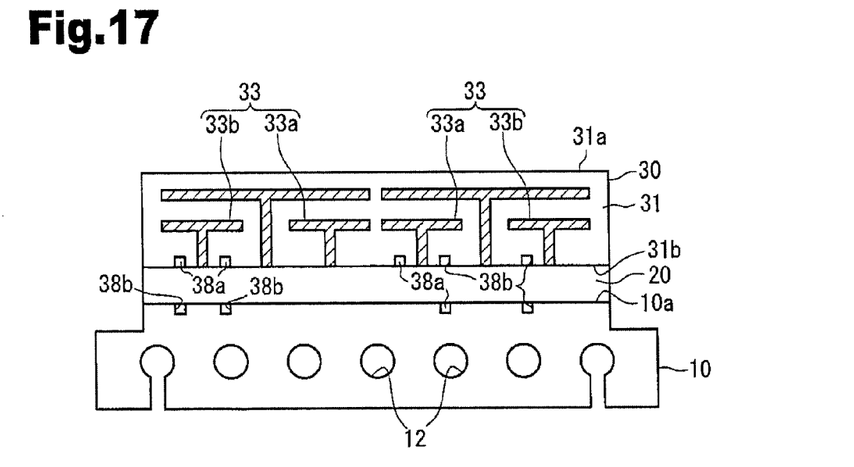
FIG. 17 is a schematic cross-sectional view of a further electrostatic chuck.

As illustrated in FIG. 17, the adjustment portions 37 may be formed in both of the adhering surface 31b of the electrostatic chuck plate 30 (plate body 31) and the upper surface 10a of the base plate 10.

The resin filling each adjustment portion 37 may be changed. For example, a resin having higher heat conductivity than the material (e.g., silicone resin) of the adhesive layer 20 may be used. Such a resin may be a resin paste containing metal, such as silver (Ag) or copper (Cu), aluminum nitride, or boron nitride as a filing material. A metal such as silver or copper has higher heat conductivity than the ceramic used as the material of the plate body 31. This allows for the heat density to be lowered so that the heat density in the substrate setting surface 31a of the plate body 31 is uniform and the substrate W is controlled at a uniform temperature.

Heat conduction may be adjusted in the adhesive layer (that is, connecting layer) connecting the electrostatic chuck plate 30 and the base plate 10. For example, the heat conduction from the electrostatic chuck plate 30 (resistance heat generation bodies 33) to the base plate 10 (cooling conduits 12) may be adjusted by embedding a resin having a heat conductivity that differs from the material of the connecting layer (resin) in the connecting layer. Such a connecting layer may be formed, for example, through the steps illustrated in FIGS. 18A to 18D.

Figure 18A:
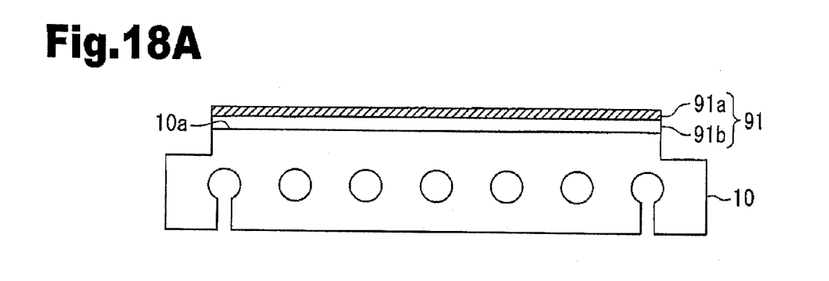
FIGS. 18A to 18D are schematic cross-sectional views illustrating manufacturing steps of the further electrostatic chuck.

As illustrated in FIG. 18A, a resin 91 is applied to the base plate 10, and the resin 91 is cured. For example, thermosetting resin or photo-curing resin, which is cured by the ultraviolet light, may be used as the resin 91.

The cured resin 91 is then polished through chemical machine polishing (CMP) or the like to remove an upper portion 91a (hatched portion in FIG. 18A) of the resin 91.

Figure 18B:
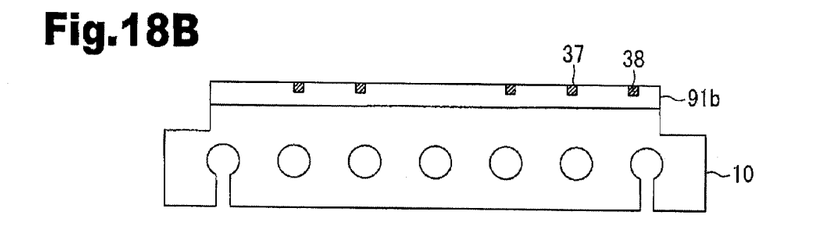

Then, as illustrated in FIG. 18B, the adjustment portions 37 are formed in the resin 91b, and the adjustment portions 37 are filled with the adjustment resin 38. The adjustment resin 38 may be a resin having heat conductivity that differs from the heat conductivity of the resin 91b, for example, a resin paste containing metal, such as silver (Ag), copper (Cu), and a filling material, such as aluminum nitride and boron nitride. After filling the adjustment resin 38, the adjustment resin 38 is, for example, cured and heated. A photo-curing resin containing a filling material may also be used as the adjustment resin 38.

Figure 18C:
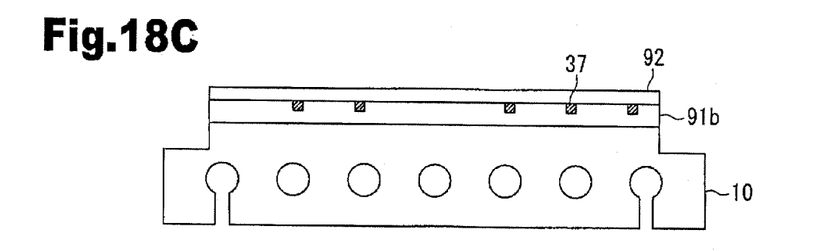
Figure 18D:
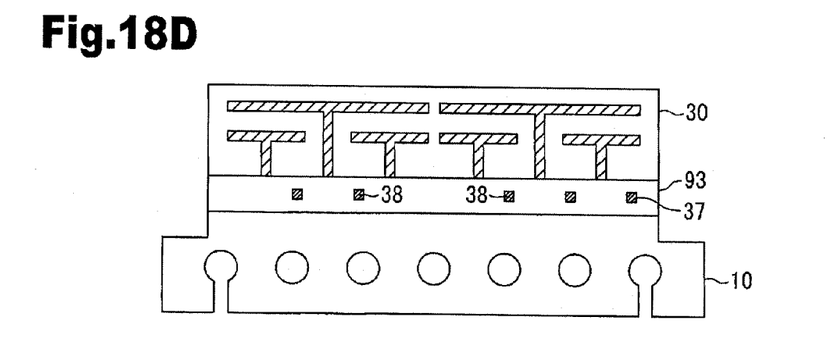

As illustrated in FIG. 18C, resin 92 is applied on the resin 91b. The electrostatic chuck plate is laminated on the resin 92. In this case, the electrostatic chuck plate may be a substrate (e.g., ceramic substrate 72 illustrated in FIG. 10) not including the adjustment portion 37, or may be the electrostatic chuck plate 30 including the adjustment portion 37. Thereafter, the resin 92 is cured. As illustrated in FIG. 18D, the base plate 10 and the electrostatic chuck plate 30 are connected to each other by an adhesive layer 93 including the adjustment portion 37 and the adjustment resin 38.

In the electrostatic chucks illustrated in FIGS. 1A, 16, and FIG. 17, the adhesive layer 93 including the adjustment portions 37 and the adjustment resins 38 illustrated in FIG. 18D may be used in place of the adhesive layer 20.

The device for measuring the heat density distribution (temperature distribution) is not limited to the measurement device 61 described above and may be another device.

For example, the heat density distribution of the electrostatic chuck plate may be measured using an X-ray device. In this case, the electrostatic chuck plate subsequent to baking, for example, the ceramic substrate 72b illustrated in FIG. 9, may be used as a substrate for measuring the heat density distribution. The shape (thickness, width) of the resistance heat generation bodies 33 may be measured by analyzing the image of the ceramic substrate 72b captured by X-rays. The X-ray is an example of an electromagnetic wave. The heat density distribution can be calculated as described above using the measurement results of the X-ray device. The shape of the resistance heat generation bodies 33 (wiring pattern 55) may be measured using the ceramic substrate 72b (see FIG. 10) subsequent to machining, and the stacked green sheets 51 to 53 may be used to calculate the heat density distribution.

The heat density distribution (temperature distribution) of the electrostatic chuck plate may be measured using a thermometer. In this case, the electrostatic chuck plate subsequent to baking, for example, the ceramic substrate 72b illustrated in FIG. 9, may be used as a substrate for measuring the heat density distribution. The electrodes 36a to 36d (see FIG. 1A) connected to the resistance heat generation bodies 33 are connected to the heating power supply, the resistance heat generation bodies 33 are supplied with current to generate heat, and the surface temperature of the ceramic substrate 72b is measured. A contact type thermometer (e.g., thermometer using thermocouple) or contactless type thermometer (e.g., infrared thermometer) can be used for the temperature measurement. The heat density distribution can be calculated from the surface temperature measured in this manner.

This disclosure further encompasses various examples described below.

1. A method for manufacturing an electrostatic chuck including a base plate and an electrostatic chuck plate, wherein the base plate includes a cooling mechanism, and the electrostatic chuck plate is connected to the base plate by an adhesive layer, the method comprising:

forming the electrostatic chuck plate, wherein the electrostatic chuck plate includes a substrate setting surface, an electrostatic electrode capable of attracting a processed substrate set on the substrate setting surface, and a resistance heat generation body capable of heating the processed substrate;

calculating a heat density distribution of the substrate setting surface;

forming an adjustment portion at a position according to the heat density distribution in at least one of an upper surface of the base plate and a lower surface of the electrostatic chuck plate that faces the upper surface through the adhesive layer;

filling the adjustment portion with an adjustment resin, the adjustment resin having a heat conductivity according to the heat density distribution; and adhering the electrostatic chuck plate to the upper surface of the base plate with the adhesive layer.

2. A method for manufacturing an electrostatic chuck including a base plate and an electrostatic chuck plate, wherein the base plate includes a cooling mechanism, and the electrostatic chuck plate is connected to the base plate by an adhesive layer, the method comprising:

forming the electrostatic chuck plate, wherein the electrostatic chuck plate includes a substrate setting surface, an electrostatic electrode capable of attracting a processed substrate set on the substrate setting surface, and a resistance heat generation body capable of heating the processed substrate;

calculating a heat density distribution of the substrate setting surface;

applying a first resin to an upper surface of the base plate and curing the first resin;

polishing a surface of the first resin;

forming an adjustment portion at a position according to the heat density distribution in an upper surface of the first resin that has been polished;

filling the adjustment portion with an adjustment resin, the adjustment resin having a heat conductivity according to the heat density distribution;

applying a second resin to the upper surface of the first resin after filling the adjustment portion with the adjustment resin; and adhering the electrostatic chuck plate to the second resin.

3. The method according to clause 1, wherein the adjustment resin is formed from a material that is the same as that of a resin forming the adhesive layer, and the filling the adjustment portion with an adjustment resin includes filling the adjustment portion with a portion of the adhesive layer when adhering the electrostatic chuck plate to the upper surface of the base plate with the adhesive layer.

4. The method according to clause 1, wherein the forming an adjustment portion includes determining forming parameters of the adjustment portion based on the calculation of the heat density distribution, and the forming parameters include position, shape, and number of the adjustment portion.

5. The method according to clause 1, wherein the forming the electrostatic chuck plate includes stacking a first green sheet that forms the substrate setting surface, a second green sheet on which the electrostatic electrode is formed, and a third green sheet on which the resistance heat generation body is formed, and baking a stacked body of the first to third green sheets.

6. The method according to clause 1, wherein the calculating a heat density distribution includes measuring a shape of the resistance heat generation body, and calculating the heat density distribution based on a measurement result of the shape of the resistance heat generation body.

7. The method according to clause 6, wherein the measuring a shape of the resistance heat generation body includes measuring the shape of the resistance heat generation body, formed on the third green sheet, in a contactless manner.

8. The method according to clause 6, wherein the measuring a shape of the resistance heat generation body includes measuring the shape of the resistance heat generation body, incorporated in the electrostatic chuck plate, with an electromagnetic wave.

9. The method according to clause 1, wherein the calculating a heat density distribution includes supplying current to and heating the resistance heat generation body formed in the electrostatic chuck plate, measuring a temperature of the substrate setting surface when the resistance heat generation body is heated, and calculating the heat density distribution based on a measurement result of the temperature of the substrate setting surface.

The present examples and embodiments are to be considered as illustrative and not restrictive, and the invention is not to be limited to the details given herein, but may be modified within the scope and equivalence of the appended claims.

The invention claimed is:

1. An electrostatic chuck comprising:
a base plate including a cooling mechanism;
an adhesive layer arranged on an upper surface of the base plate;
an electrostatic chuck plate connected to the base plate by the adhesive layer, wherein the electrostatic chuck plate includes
a substrate setting surface on which a processed substrate is set,
an electrostatic electrode capable of attracting the processed substrate, and
a resistance heat generation body capable of heating the processed substrate,
wherein the electrostatic electrode and the resistance heat generation body are incorporated in the electrostatic chuck plate;
an adjustment portion arranged at a position according to a temperature distribution of the substrate setting surface in a lower surface of the electrostatic chuck plate that faces the upper surface of the base plate through the adhesive layer; and
a resin having a heat conductivity according to the temperature distribution and filled in the adjustment portion.

2. The electrostatic chuck according to claim 1, further comprising:
an adjustment resin incorporated in the adhesive layer at a position according to the temperature distribution of the substrate setting surface, wherein the adjustment resin has a heat conductivity that differs from that of a resin forming the adhesive layer.

3. The electrostatic chuck according to claim 1, wherein the adjustment portion is a recess.

4. The electrostatic chuck according to claim 1, wherein the resin filled in the adjustment portion is formed from a material that is the same as that of a resin forming the adhesive layer.

5. The electrostatic chuck according to claim 1, wherein the adjustment portion is further arranged at a position according to the temperature distribution of the substrate setting surface in the upper surface of the base plate.

6. The electrostatic chuck according to claim 1, wherein the adjustment portion is a recess that is recessed from the lower surface of the electrostatic chuck plate toward the substrate setting surface.

7. The electrostatic chuck according to claim 1, wherein the resistance heat generation body includes first and second resistance heat generation bodies that are arranged in the electrostatic chuck plate and coplanar with each other,
the first resistance heat generation body is located at a position corresponding to a central portion of the substrate setting surface, and
the second resistance heat generation body is located at a position corresponding to a peripheral portion of the substrate setting surface.

* * * * *